(12) United States Patent
Im et al.

(10) Patent No.: US 11,119,517 B2
(45) Date of Patent: Sep. 14, 2021

(54) METHOD OF DYNAMIC THERMAL MANAGEMENT OF ELECTRONIC DEVICE

(71) Applicant: Samsung Electronics Co., Ltd., Suwon-si (KR)

(72) Inventors: Yun-Hyeok Im, Hwaseong-si (KR); Myung-Kyoon Yim, Seoul (KR); Wook Kim, Yongin-si (KR); Kyoung-Min Lee, Yongin-si (KR); Kyung-Soo Lee, Yongin-si (KR)

(73) Assignee: Samsung Electronics Co., Ltd.

( * ) Notice: Subject to any disclaimer, the term of this patent is extended or adjusted under 35 U.S.C. 154(b) by 46 days.

(21) Appl. No.: 15/841,734

(22) Filed: Dec. 14, 2017

(65) Prior Publication Data

US 2018/0259985 A1    Sep. 13, 2018

(30) Foreign Application Priority Data

Mar. 8, 2017 (KR) .......................... 10-2017-0029747

(51) Int. Cl.
*G05D 23/19* (2006.01)
*H05K 7/20* (2006.01)
(Continued)

(52) U.S. Cl.
CPC ......... *G05D 23/1931* (2013.01); *G01K 13/00* (2013.01); *G06F 1/206* (2013.01); *H05K 7/20* (2013.01)

(58) Field of Classification Search
CPC ...... G05D 23/1932; G05D 23/24; H05K 7/20; G06F 1/206
(Continued)

(56) References Cited

U.S. PATENT DOCUMENTS 7,050,959 B1   5/2006   Pollard, II et al.
7,167,778 B2   1/2007   Yazawa et al.
(Continued)

FOREIGN PATENT DOCUMENTS

KR   20130061487   6/2013
KR   20130136266   12/2013
(Continued)

OTHER PUBLICATIONS

Korean Office Action dated May 11, 2021 issued in corresponding Korean Application No. 10-2017-0029747.

*Primary Examiner* — Santosh R Poudel
(74) *Attorney, Agent, or Firm* — Onello & Mello, LLP

(57) ABSTRACT

To dynamically manage a temperature of an electronic device, a local temperature is provided by measuring a temperature of a local spot in the electronic device and a reference temperature is provided by measuring a temperature of a reference spot in the electronic device where the reference spot and the local spot are thermally coupled. A target temperature corresponding to a limit value of the reference temperature is adjusted based on the local temperature and a power level of the electronic device is controlled based on the same target temperature. The target temperature may be set to a relatively high value to secure performance of the electronic device when the local temperature is relatively low. Alternatively, the target temperature may be set to a relatively low value to pursue stability of the electronic device when the local temperature is relatively high.

18 Claims, 12 Drawing Sheets

(51) Int. Cl.
*G01K 13/00* (2021.01)
*G06F 1/20* (2006.01)

(58) Field of Classification Search
USPC .......................................................... 700/299
See application file for complete search history.

(56) References Cited

U.S. PATENT DOCUMENTS

| | | | |
|---|---|---|---|
| 7,347,621 B2 | 3/2008 | Sri-Jayantha et al. | |
| 7,520,669 B2 | 4/2009 | Yazawa et al. | |
| 8,260,473 B1 * | 9/2012 | O'Brien | H01L 23/34 |
| | | | 700/299 |
| 8,930,724 B2 | 1/2015 | Jung | |
| 8,988,115 B2 | 3/2015 | Jaechoon et al. | |
| 9,006,000 B2 | 4/2015 | Hanan et al. | |
| 9,411,343 B2 * | 8/2016 | Yao | G05D 23/19 |
| 9,606,591 B2 | 3/2017 | Kwon et al. | |
| 9,829,941 B1 * | 11/2017 | Saeidi | G06F 1/3206 |
| 2005/0071705 A1 * | 3/2005 | Bruno | G06F 1/206 |
| | | | 713/500 |
| 2005/0273208 A1 | 12/2005 | Yazawa et al. | |
| 2006/0013281 A1 | 1/2006 | Sri-Jayantha et al. | |
| 2007/0213882 A1 | 9/2007 | Inukai et al. | |
| 2008/0043807 A1 | 2/2008 | Yazawa et al. | |
| 2009/0222147 A1 * | 9/2009 | Nakashima | G06F 1/206 |
| | | | 700/300 |
| 2010/0214739 A1 * | 8/2010 | Guan | G06F 1/206 |
| | | | 361/679.48 |
| 2013/0046999 A1 * | 2/2013 | Jung | G06F 1/206 |
| | | | 713/300 |
| 2013/0091348 A1 | 4/2013 | Kwon et al. | |
| 2013/0139524 A1 | 6/2013 | Kim et al. | |
| 2013/0169347 A1 * | 7/2013 | Kim | G06F 1/206 |
| | | | 327/513 |
| 2013/0321041 A1 | 12/2013 | Jaechoon et al. | |
| 2014/0163765 A1 * | 6/2014 | Jain | G06F 1/206 |
| | | | 700/300 |
| 2014/0192835 A1 | 7/2014 | Caroff et al. | |
| 2014/0195066 A1 * | 7/2014 | Nanda | G06F 1/203 |
| | | | 700/300 |
| 2014/0236380 A1 * | 8/2014 | Alton | G06F 1/206 |
| | | | 700/299 |
| 2014/0254092 A1 | 9/2014 | Im et al. | |
| 2014/0324245 A1 | 10/2014 | Kwon et al. | |
| 2015/0088333 A1 | 3/2015 | Delano et al. | |
| 2015/0346785 A1 * | 12/2015 | Chen | H04M 1/18 |
| | | | 455/575.1 |
| 2015/0350407 A1 * | 12/2015 | Hsu | H04M 1/72569 |
| | | | 455/418 |
| 2016/0084542 A1 | 3/2016 | Kim et al. | |
| 2016/0266629 A1 * | 9/2016 | Merrikh | G06F 1/324 |
| 2017/0068261 A1 * | 3/2017 | Hsu | G05D 23/1917 |
| 2017/0111988 A1 * | 4/2017 | Wang | G06F 1/324 |
| 2017/0160707 A1 * | 6/2017 | Srinivasan | G06F 1/3206 |
| 2017/0269655 A1 * | 9/2017 | Chu | G06F 1/206 |
| 2017/0351279 A1 * | 12/2017 | Ishii | G06F 1/1626 |

FOREIGN PATENT DOCUMENTS

| | | |
|---|---|---|
| KR | 20140085229 | 7/2014 |
| KR | 20140111449 | 9/2014 |

\* cited by examiner

METHOD OF DYNAMIC THERMAL MANAGEMENT OF ELECTRONIC DEVICE

CROSS-REFERENCE TO RELATED APPLICATION

This U.S. non-provisional application claims priority from Korean Patent Application No. 10-2017-0029747, filed on Mar. 8, 2017, in the Korean Intellectual Property Office (KIPO), and all the benefits accruing therefrom under 35 U.S.C. 119, the disclosure of which is incorporated by reference in its entirety herein.

BACKGROUND

1. Technical Field

Example embodiments relate generally to an electronic device, and, more particularly, to a method of dynamic thermal management of an electronic device.

2. Discussion of the Related Art

Modern electronic devices commonly include integrated circuits such as system-on-chip (SOC) circuits. The SOC commonly takes the form of a chip, and, in particular, a microelectronics system integrated onto the chip. In recent years, various circuits having synergistic functionality are integrated together on the same chip in an effort to increase the degree of integration of the SOC. In addition, the operational speed of the SOC continues to increase in order to satisfy user demand. As the degree of integration and the operational speed of SOCs continue to increase, temperature management, or thermal management, becomes an increasingly important factor in the monitoring and controlling of temperature variation of the SOC.

SUMMARY

Some example embodiments provide a method of dynamic thermal management for efficiently controlling a temperature of an electronic device, while maintaining stable operation.

Some example embodiments provide an electronic device that performs a method of dynamic thermal management for efficiently controlling a temperature of the electronic device, while maintaining stable operation.

According to example embodiments, a method of dynamic thermal management of an electronic device comprises: providing a local temperature measurement by measuring a local temperature of a local spot in the electronic device; providing a reference temperature measurement by measuring a reference temperature of a reference spot in the electronic device, the reference spot being thermally coupled to the local spot; adjusting a target temperature corresponding to a limit value of the reference temperature measurement based on the local temperature measurement; and controlling a power output of the electronic device based on the target temperature.

According to example embodiments, a method of dynamic thermal management of a portable electronic device comprises: providing a local temperature measurement by measuring a temperature of a hot spot adjacent to a heat source of the portable electronic device; providing a reference temperature measurement by measuring a temperature of a housing case of the portable electronic device, the housing case being thermally coupled to the hot spot; adjusting a target temperature corresponding to a limit value of the reference temperature measurement when the local temperature measurement increases; and controlling a power level of the portable electronic device based on the target temperature.

According to example embodiments, a temperature management circuit of an electronic device comprises: a local temperature sensor configured to provide a local temperature measurement by measuring a temperature of a local spot in the electronic device; a reference temperature sensor configured to provide a reference temperature measurement by measuring a temperature of a reference spot in the electronic device, the reference spot being thermally coupled to the local spot; and a temperature management unit configured to change a target temperature corresponding to a limit value of the reference temperature measurement based on the local temperature measurement.

The method of dynamic thermal management of the electronic device according to example embodiments may efficiently perform thermal management of the electronic device by changing the target temperature corresponding to a limit value of the reference temperature based on the local temperature. In some embodiments, the local spot and the reference spot are thermally coupled. The target temperature may be set to a relatively high value to secure performance of the electronic device when the local temperature is relatively low. Alternatively, the target temperature may be set to a relatively low value to pursue stability of the electronic device when the local temperature is relatively high.

BRIEF DESCRIPTION OF THE DRAWINGS

These and other aspects and features of the present disclosure will become apparent by describing in detail example embodiments thereof, with reference to the attached drawings, in which.

DETAILED DESCRIPTION OF EMBODIMENTS

Figure 1:
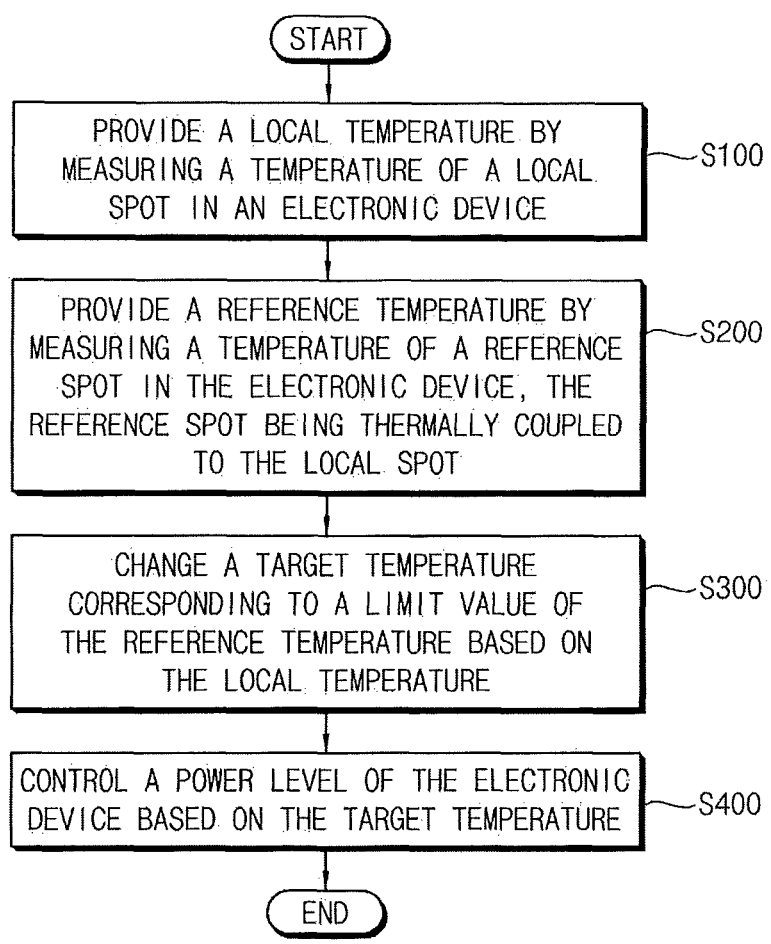
FIG. 1 is a flow diagram representing a method of dynamic thermal management of an electronic device according to some embodiments of the present disclosure.

Various example embodiments are described more fully herein with reference to the accompanying drawings, in which some example embodiments are shown. In the drawings, like numerals refer to like elements throughout.

FIG. 1 is a flow diagram representing a method of dynamic thermal management of an electronic device according to some embodiments of the present disclosure.

Referring to FIG. 1, a local temperature may be provided by measuring a temperature of a local spot in an electronic device (S100). A reference temperature may be provided by measuring a temperature of a reference spot in the electronic device (S200), where the reference spot is thermally coupled to the local spot. The term "thermally coupled", as used herein, may represent that there is present a heat conduction path of a certain thermal conductivity between the local spot and the reference spot and may represent that a temperature change of one spot affects a temperature of the other corresponding spot. The local spot and the reference spot may be properly determined depending on the operation scenario of the given electronic device. The local temperature and the reference temperature may be provided, for example, using temperature sensors of various types known to those of ordinary skill in the art. Example embodiments of the local and reference spots and the temperature sensors are described herein in connection with the embodiments of FIGS. 11 through 14. The term "spot" as used herein can refer to a particular location or region of the electronic device, its chip, its package, or another portion of the device where temperature monitoring is desired.

In some embodiments, a target temperature corresponds to a limit value of the reference temperature. In some embodiments, the target temperature may be changed or adjusted based on the local temperature (S300). In some embodiments, a power level of the electronic device may be controlled in response to the target temperature (S400).

Electronic devices continue to become more highly integrated. At the same time, consumers continue to demand increased performance. Accordingly, semiconductor packages also likewise manufactured to have a relatively small size and high density. The relatively higher performance of high-density semiconductor packages operating at higher speeds results in the generation of increased heat present in the semiconductor packages. Thus, sufficient thermal dissipation becomes one of the most important factors for increasing operation stability and product reliability of semiconductor packages and electronic systems including the semiconductor packages. The term "sufficient" in this scenario, in connection with thermal dissipation, allows and accounts for certain limits to be put in place to prevent overheating and to maintain the operational temperature within a proper range.

In some electronic devices, such as mobile electronic devices, the temperature of a semiconductor chip and the temperature of a surface of a housing case may be increased due to the heat generated through operation of the electronic device. Such an increase in the temperature of the semiconductor chip may cause malfunction, reliability degradation, lifetime reduction, or other concerns. An increase in the temperature at the housing surface, or at locations external to device, can, in some cases, burn the skin of a user, or otherwise cause displeasure to a user. In view of these concerns, in the optimization and operation of an electronic device including an integrated circuit or a semiconductor chip, a dynamic thermal management (DTM) process may be adopted. In some example embodiments, a DTM process may be employed so that the operation of the semiconductor chip in the electronic device may be automatically halted by temperature control software in a case where an operational temperature of the semiconductor chip is increased over a predetermined target temperature.

For example, according to the DTM process of the present embodiment, a target temperature of the semiconductor chip and/or a target temperature of the housing case may be set in advance of the operation. Operation at of the semiconductor chip in some embodiments may be restricted automatically if the operational temperature of the semiconductor chip exceeds the predetermined target temperature and/or if the operational temperature of the housing case exceeds the predetermined target temperature.

In some embodiments, a spot of the most significant heat source may be selected as a desired location for monitoring temperature in connection with the DTM process. At the same time, the actual spot of the maximum temperature of an electronic device may be varied depending on the operational scenario of the device. While this approach might allow for operational determinations based on the most volatile or extreme temperature spot in a DTM operation, under this scenario, the temperature of the semiconductor chip may be allowed to increase excessively if the DTM process is based on a temperature of only a single spot. In addition, if the target temperature is fixed to a constant value, then the process is not suitable for detecting abrupt changes in operational conditions.

The method of dynamic thermal management of the electronic device according to some embodiments may efficiently perform thermal management of the electronic device by changing the target temperature corresponding to a limit value of the reference temperature based on the local temperature in a configuration when the local spot and the reference spot are thermally coupled. The target temperature may be set to a relatively high value to secure performance of the electronic device when the local temperature is relatively low. The target temperature may be set to a relatively low value to pursue stability of the electronic device when the local temperature is relatively high.

Figure 2:
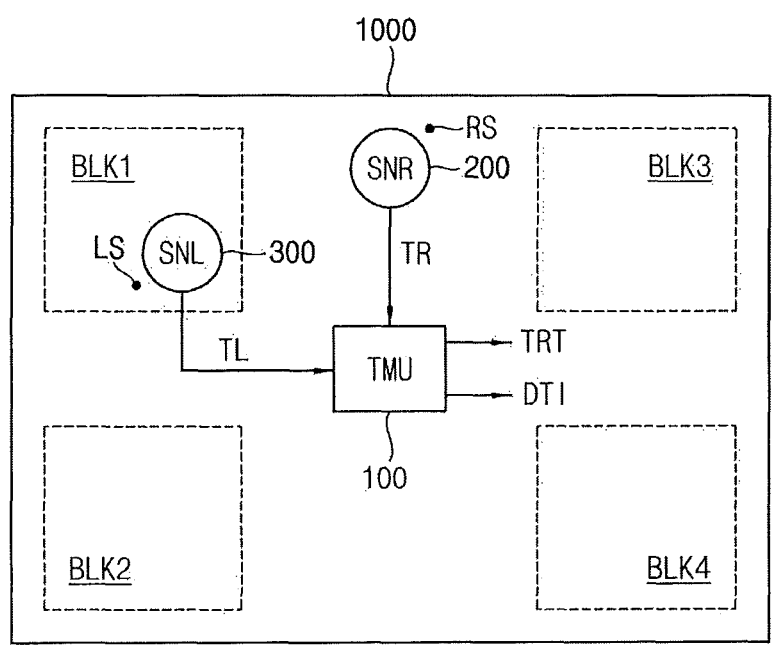
FIG. 2 is a diagram representing a layout of a temperature management circuit in an electronic device according to some embodiments of the present disclosure.

FIG. 2 is a block diagram of a layout of a temperature management circuit in an electronic device according to some embodiments of the present disclosure.

Referring to FIG. 2, a temperature management circuit in an electronic device 1000 may include a temperature management unit or a thermal management unit (TMU) 100, a reference temperature sensor (SNR) 200 and at least one local temperature sensor (SNL) 300. Throughout the specification, the acronym TMU refers to either the temperature management unit or a thermal management unit 100. FIG. 2 represents a system including one, single, local temperature sensor 300 for the convenience of description; however, the number of local temperature sensors 300 may vary according to a configuration of the electronic device 1000. Other elements in the electronic device 1000 are omitted in this embodiment, except for those corresponding to the operation of the temperature management unit 100.

In some embodiments, the electronic device 1000 may include a system on chip (SOC) and the SOC may include a single or a plurality of subsidiary blocks (BLKi) wherein "i"=1, 2, 3, 4, etc. which may be individualized by their own individual functions. For example, the subsidiary blocks BLKi may include a core block which may include a central processing unit, a memory controller, a display controller block, a file system block, a graphic processing unit block, an image signal processing block, a multi-format codec block, and or any other component known to those of ordinary skill in the art. These subsidiary blocks may correspond to significant heat sources that are present in the SOC. In some embodiments, it may be desired to monitor and control the respective temperatures of the subsidiary blocks BLKi in addition to the overall temperature of the SOC.

In some embodiments, the reference temperature sensor 200 may monitor and measure a temperature of a reference spot (RS) in order to provide a reference temperature (TR). The local temperature sensor 300 may measure a temperature of a local spot (LS) in order to provide a local temperature (TL). The reference spot RS and the local spot LS may be spaced apart from each other on the electronic device 1000, and may be thermally coupled through a medium comprising a certain thermal conductivity.

The temperature management unit 100 may provide a target temperature (TRT) and temperature information (DTI) based on the measured local temperature (TL) and the measured reference temperature (TR). According to some embodiments, the temperature management unit 100 may change the target temperature (TRT) as a result of a limit value of the reference temperature TR relative to the local temperature TL. The power level of the electronic device 1000 may be controlled based on the temperature information DTI and the target temperature TRT received from the temperature management unit 100.

In some embodiments, the local spot LS may be selected to correspond to a hot spot in the region of, or adjacent to, a heat source or a heat aggressor in the electronic device 1000. In other embodiments, the local spot LS may correspond to an arbitrary spot that is affected by the temperature of the local spot LS. In other words, in some operational situations, the reference temperature TR of the reference spot RS may be equal to or lower than the local temperature TL of the local spot LS. This may be beneficial for determining the heat difference corresponding to thermal coupling between the reference spot RS and the local spot LS.

In an example embodiment, the local spot LS may be positioned in the region of a processor that generates a large amount of heat and the reference spot RS may be positioned on a housing case of the electronic device 1000. Such close proximity between the local spot LS and reference spot RS may be preferred for determining information related to the differences in temperature in a local area. In this embodiment, as will be described below with reference to FIGS. 11 through 14, the reference temperature sensor SNR 200 may be implemented as a non-contact temperature sensor and the local temperature sensor SNL 300 may be implemented as an on-chip temperature sensor that is integrated into the processor or may be otherwise present on the semiconductor die, in which processor is integrated, for example, according to techniques known to those of skill in the art.

Figure 3:
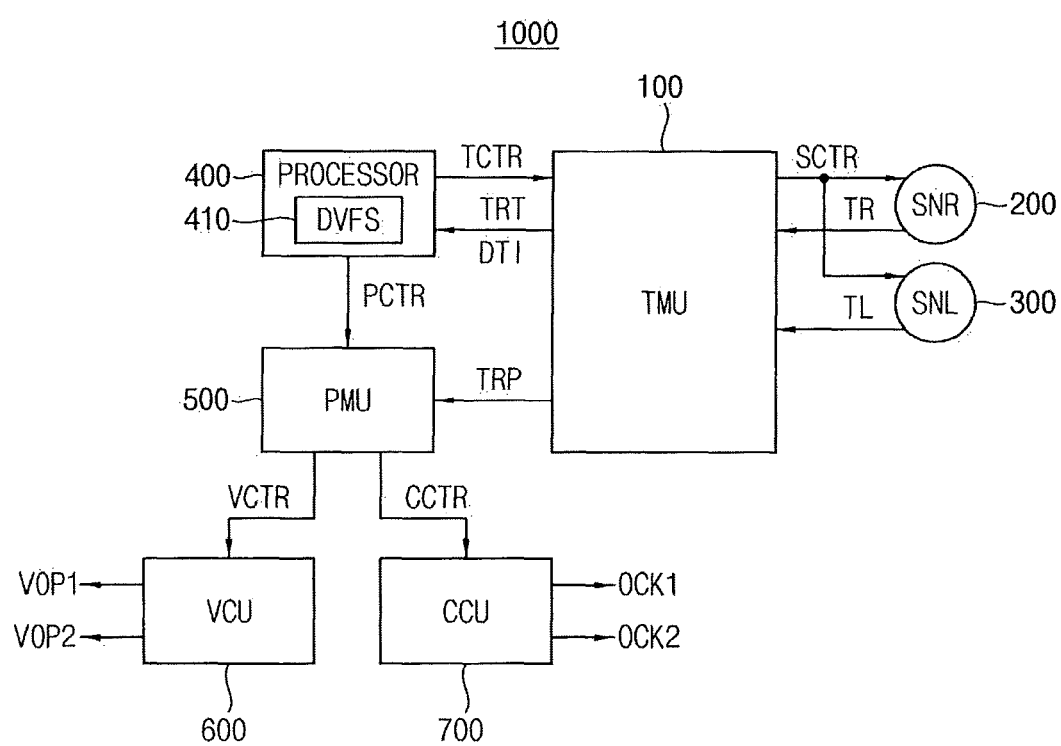
FIG. 3 is a block diagram representing an electronic device including a temperature management circuit according to some embodiments of the present disclosure.

FIG. 3 is a block diagram representing an electronic device including a temperature management circuit according to some embodiments of the present disclosure.

Referring to FIG. 3, an electronic device 1000 may include a temperature management unit (TMU) 100, a reference temperature sensor (SNR) 200, at least one local temperature sensor (SNL) 300, a processor 400, a power management unit (PMU) 500, a voltage control unit (VCU) 600 and a clock control unit (CCU) 700. The embodiment of FIG. 3 represents a configuration that employs a single local temperature sensor SNL 300 for the convenience of description, but the number of the subsidiary local temperature sensors may vary according to the desired configuration of the electronic device 1000. The electronic device 1000 may comprise other various components which are omitted in FIG. 3 for the convenience of description of the inventive concepts.

As described herein, the reference temperature sensor SNR 200 may measure a temperature of a reference spot RS to provide a reference temperature TR. The local temperature sensor SNL 300 may measure a temperature of a local spot LS to provide a local temperature TL. In some embodiments, the reference spot RS and the local spot LS may be spaced apart and may be thermally coupled through a medium having a certain thermal conductivity.

In some embodiments, the temperature management unit 100 may provide a target temperature TRT and temperature information DTI based on the local temperature TL and the reference temperature TR. According to some embodiments, the temperature management unit 100 may change the target temperature TRT corresponding to a limit value of the reference temperature TR based on the local temperature TL. In some embodiments, the temperature management unit 100 may be initialized and controlled by a temperature management control signal TCTR from the processor 400. In some embodiments, the temperature management unit 100 may generate a tripping signal TRP when the local temperature TL and/or the reference temperature TR satisfy certain conditions. For example, the temperature management unit 100 may generate the tripping signal TRP when the reference temperature TR increases excessively over the target temperature TRT. The power management unit 500 may block a power of some or all circuit blocks in the electronic device 1000 in response to the tripping signal TRP.

A tripping signal is known to those of ordinary skill in the art as an open circuit that prevents the flow of current when certain signals are present. In some embodiments related to the present disclosure, if the local temperature is significantly higher than the reference temperature a trip signal can be generated to deactivate certain circuits of the electronic device in order to prevent overheating.

The processor 400 may generate the temperature management control signal TCTR and the power management control signal PCTR for controlling operations of the electronic device 1000 based on the target temperature TRT along with the temperature information DTI. In some embodiments, the temperature information DTI may include information related to the reference temperature TR and the local temperature TL. In some embodiments, the processor 400 may manage the presentation of power of the electronic device 1000 through a dynamic voltage and frequency scaling (DVFS) process using a DVFS module 410, as represented within the processor.

The DVFS process in some configurations, operates to vary a voltage and/or a frequency of operation of the electronic device, or of certain units of the electronic device, depending on the operational conditions of a processor 400. In some embodiments, the DVFS module 410 may include software that is executed by the processor 400. In other embodiments, the DVFS module 410 may be executed as hardware and/or firmware.

The DVFS module 410 generally may determine an operational power level among a plurality of different power levels corresponding to a present operational condition. In some embodiments, the power level or the power output may be represented by at least one of the operational voltage and the operational frequency. In other words, the power level or the power output may be adjusted by changing at least one of the operational voltage and the operational frequency. In some embodiments, the operational voltage may be a power supply voltage and the operational frequency may be a frequency of an operational clock signal.

The DVFS module 410 may monitor the operational status or the operational condition such as workload, an operating temperature, or any operation known to one of ordinary skill in the art, of the processor 400 to determine the operating power level which corresponds to the present operational condition. For example, when the workload of the processor 400 increases, the DVFS module 410 may raise the operating power level to increase the operational voltage and/or the operational frequency. Conversely, when the workload of the processor 400 decreases, the DVFS module 410 may lower the operating power level to decrease the operational voltage and/or the operational frequency. When the operational temperature increases to a temperature that is out of a normal operation range, the DVFS module 410 may lower the operating power level to decrease the operational voltage and/or the operational frequency. As a result, the power level of the electronic device 1000 may be appropriately controlled to achieve operation within a safe temperature range for securing and maintaining a stable operation of the electronic device 1000. Control in this manner serves to optimize the performance of the electronic device 1000, and in part to protect the device itself and to protect the user.

In some embodiments, the power management unit 500 may control the voltage control unit 600, also referred to as VCU and the clock control unit 700, also referred to as CCU. They can be controlled based on the power management control signal PCTR received from the processor 400 such that at least one of the operational frequency and the power supply voltage may be adjusted. In some embodiments, as illustrated in FIG. 3, the power management unit 500 may generate a voltage control signal VCTR and a clock control signal CCTR, as shown, to control operation of the voltage control unit 600 and operation of the clock control unit 700. While the present example embodiments illustrates the voltage control unit 600 and/or the clock control unit 700 as units or blocks external to, or independent of, the power management unit 500, other embodiments are possible. For example, in other example embodiments, the power management unit 500 may include the voltage control unit 600 and/or the clock control unit 700 integral with the power management unit 500.

The voltage control unit 600 may provide power supply voltages VOP1 and VOP2 to the subsidiary blocks BLKi illustrated in and described in FIG. 2 above. In some embodiments the voltage control unit 600 may include at least one voltage regulator. The voltage control unit 600 may be referred to generally as a power supply or a power management integrated circuit (PMIC). According to embodiments, the voltage control unit 600 may be implemented as another chip distinct from a chip in which the processor 400 is integrated, or, optionally, at least a portion of the voltage control unit 600 may be included in the chip of the processor 400. The voltage control unit 600 is not limited to generation of two power supply voltages VOP1, VOP2. For example, the voltage control unit 600 may generate a single power supply voltage or multiple power supply voltages of a number higher than two.

The clock control unit 700 may generate operational clock signals OCK1 and OCK2 that are provided to the subsidiary blocks BLKi. The clock control unit 700 may include at least one of a phase-locked loop (PLL), a delay-locked loop (DLL), a clock multiplier, and a clock diver. The clock control unit 700 is not limited to generation of two operational clock signals OCK1, OCK2. For example, the clock control unit 700 may generate a single operational clock signal or multiple operational clock signals of a number higher than two.

The power management unit 500 may generate a voltage control signal VCTR and a clock control signal CCTR so that the voltage control unit 600 and the clock control unit 700 may provide an appropriate operational voltage and operational frequency corresponding to the desired operating power level. The change of the power level may include change of at least one of the operational voltage and the operational frequency. In some scenarios the operational voltage may be adjusted. In some scenarios the operational frequency may be adjusted. In some scenarios the operational voltage and operational frequency may both be adjusted.

The power management unit 500 may control the power level of a portion of the electronic device 1000 independently of the power level of another portion of the electronic device 1000. For example, when the subsidiary blocks BLK1~BLK4 in FIG. 2 are included in different power domains, the operating voltages VOP1 and VOP2 provided to the subsidiary blocks BLK1~BLK4 may be controlled independently to enhance the performance of the device. Additionally, when the subsidiary blocks BLK1~BLK4 are included in different clock domains, the operating clock signals OCK1 and OCK2 provided to the subsidiary blocks BLK1~BLK4 may be controlled independently.

Figure 4:
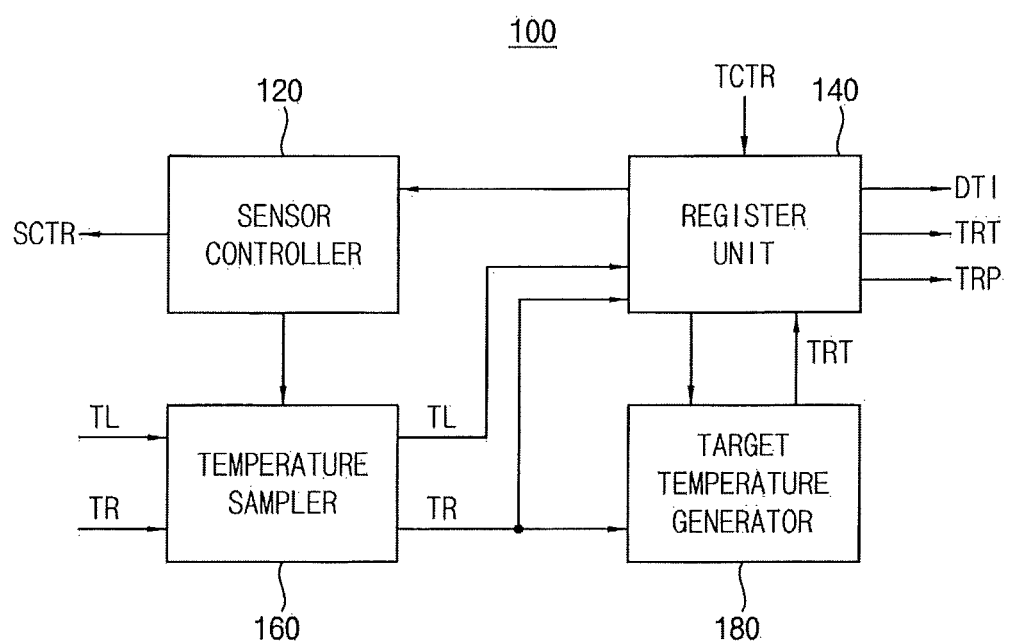
FIG. 4 is a block diagram representing an example embodiment of a temperature management unit included in the electronic device of FIG. 3.

FIG. 4 is a block diagram representing an example embodiment of a temperature management unit included in the electronic device of FIG. 3.

Referring to FIG. 4, a temperature management unit 100 may include a sensor controller 120, a register unit 140, a temperature sampler 160 and a target temperature generator 180.

The temperature sampler 160 may sample certain locations and provide the reference temperature TR from the reference temperature sensor 200 and the local temperature TL from the local temperature sensor 300. The temperature sampler 160 may sample the reference temperature TR and the local temperature TL in any time frame in response to a timing signal from the sensor controller 120. In various embodiments, the sampling of the temperature sampler 160 may occur in periodic fashion or in non-periodic fashion.

The register unit 140 may store the temperature information DTI, such as the target temperature TRT and other operational information based on the target temperature management control signal TCRT from the processor 400 in FIG. 3. The temperature information DTI may include the active reference temperature TR and the active local temperature TL. In addition, the resister unit 140 may generate interrupt signals such as a tripping signal TRP, as described above. The operational information stored in the register unit 140 may include an enable status value, an interrupt status value, a sensing period value of the temperature management unit 100, or any other value known to one of ordinary skill in the art suitable for operation of the temperature management unit 100.

The target temperature generator 180 may generate the target temperature TRT corresponding to the limit value of the reference temperature TR based on the local temperature TL. The target temperature generator 180 may change the target temperature TRT according to the change of the local temperature TL as stored in and received from the register unit 140. Temperature management of the electronic device 1000 may thereby be performed efficiently by controlling the power level of the electronic device 1000 based on the target temperature TRT changing accordingly.

Figure 5:
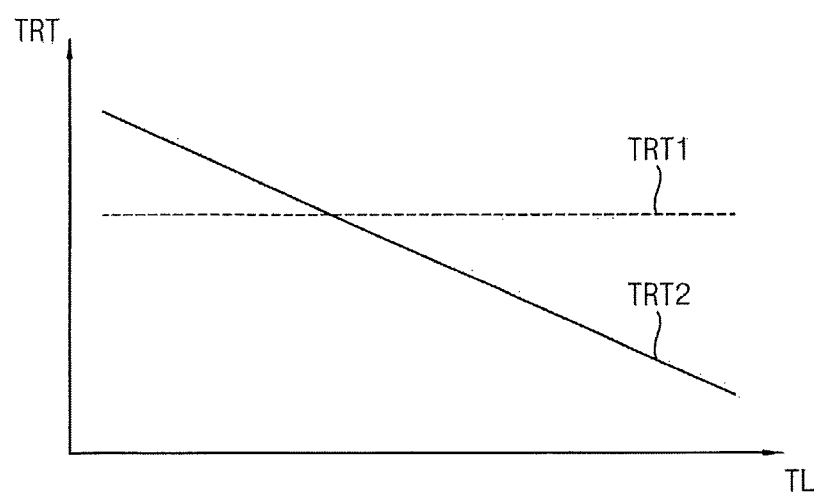
FIG. 5 is a graph representing a method of determining a target temperature according to some embodiments of the present disclosure.

FIG. 5 is a graph representing a method of determining a target temperature according to some embodiments of the present disclosure.

FIG. 5 represents a first case TRT1 in which the target temperature TRT is maintained at a constant value regardless of the local temperature TL and a second case TRT2 in which the target temperature TRT is decreased when the local temperature TL is increased according to example embodiments. The second case is displayed as a negatively sloped line. The target temperature generator 180 in FIG. 4 may decrease the target temperature TRT when the local temperature TL measured by the local temperature sensor SNL increases. In some embodiments this decrease in target temperature is illustrated as having a linear relationship; in other cases, this can take a higher-order, non-linear relationship.

Figure 8:
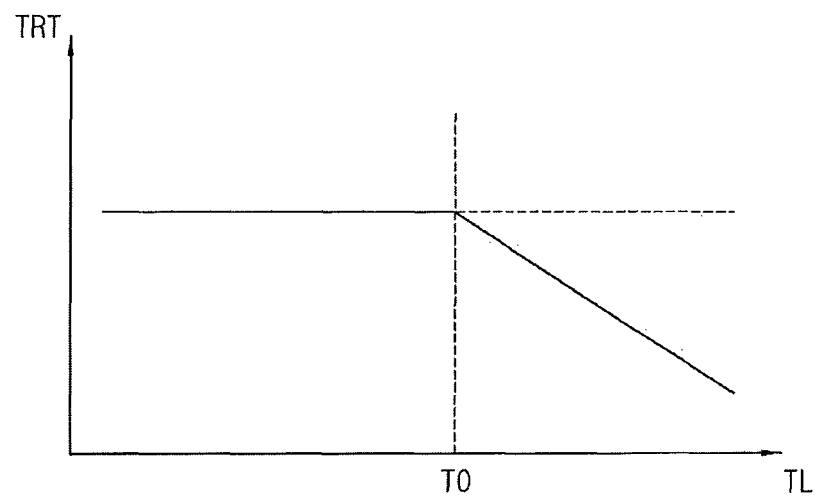
FIGS. 8, 9 and 10 are diagrams representing methods of thermal management of an electronic device when a target temperature is changed according to some embodiments of the present disclosure.
Figure 9:
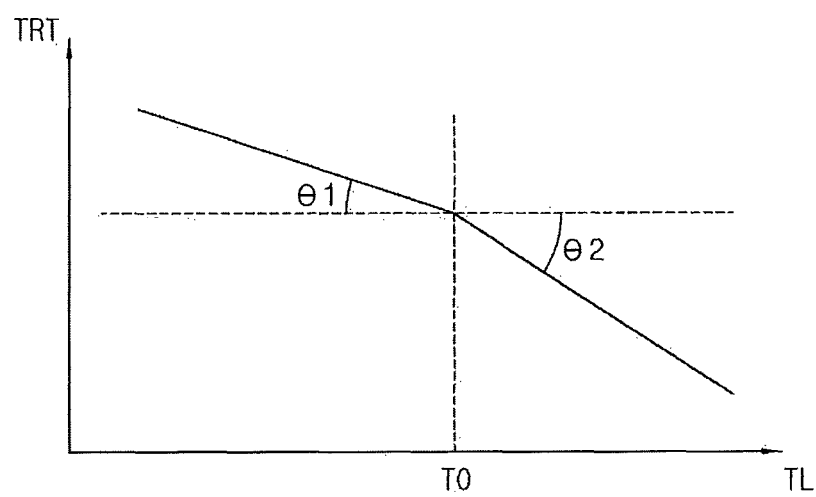
Figure 10:
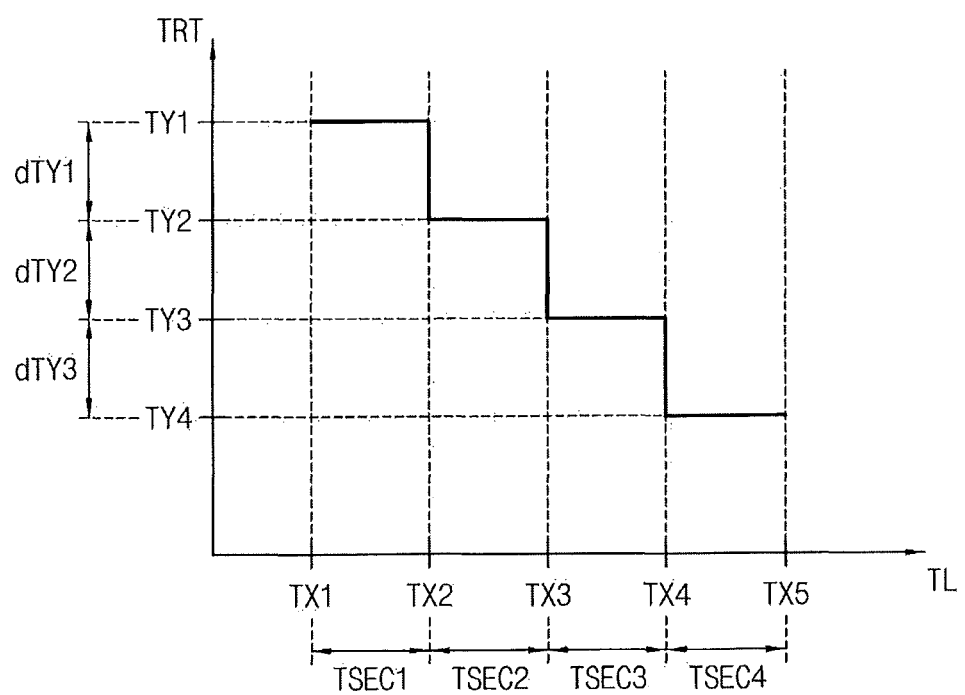

In some embodiments, the target temperature TRT may be decreased with a constant slope as the local temperature TL increases as illustrated in FIG. 5. The operation of changing the target temperature TRT relative to the local temperature LT is not limited to that of FIG. 5 and may be implemented according to various other forms as illustrated in FIGS. 8 through 10. As represented in FIGS. 8 through 10, target temperature may be set to a relatively high value to secure and validate performance of the electronic device when the local temperature is relatively low and the target temperature may be set to a relatively low value to pursue stability of the electronic device when the local temperature is relatively high.

Figure 6:
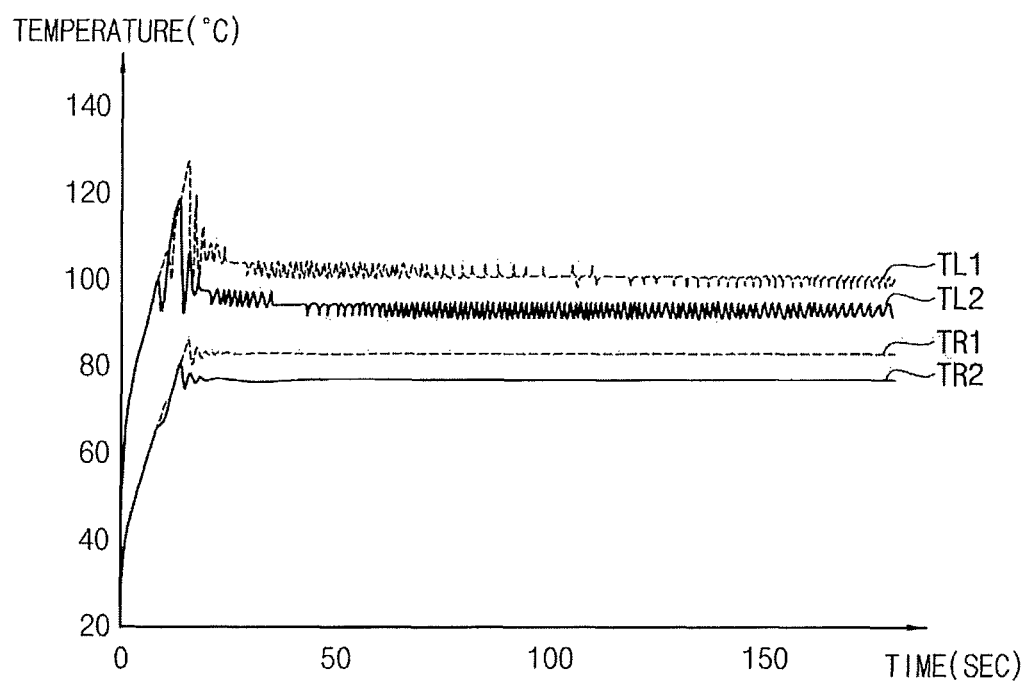
FIG. 6 is a graph representing a method of thermal management of an electronic device in a situation in which a target temperature is fixed.
Figure 7:
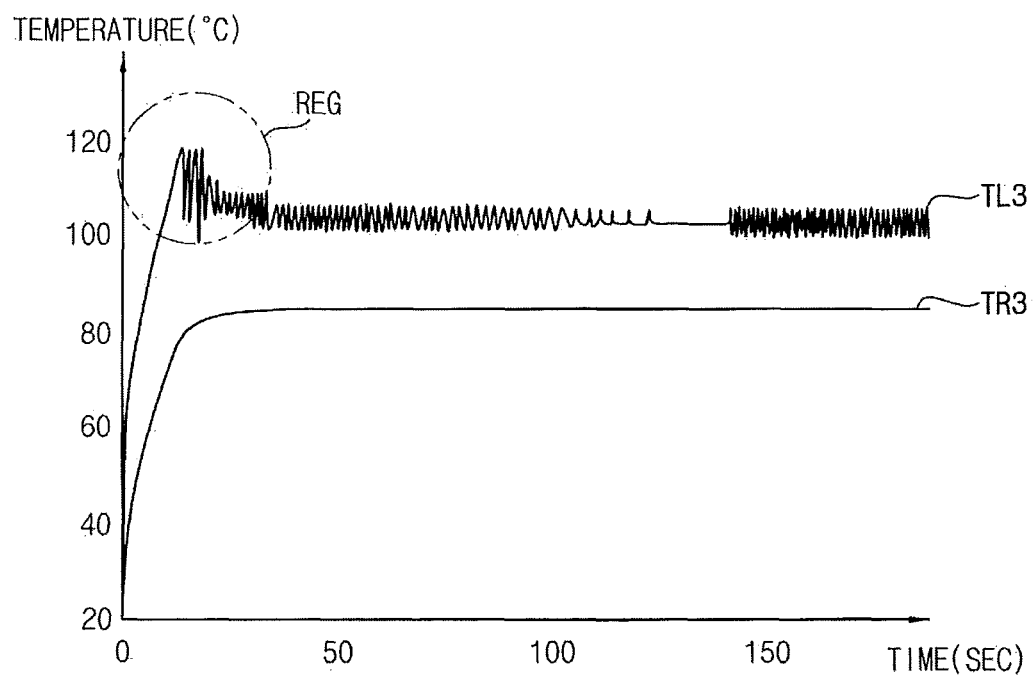
FIG. 7 is a graph representing a method of the thermal management of an electronic device when a target temperature is changed in some embodiments of the present disclosure.

FIG. 6 is a graph representing a method of thermal management of an electronic device when a target temperature is fixed, and FIG. 7 is a graph representing a method of thermal management of an electronic device when a target temperature is changed according to an example embodiment.

FIG. 6 illustrates the local temperature TL and the reference temperature TR when the target temperature TRT is maintained constant as represented in the first case TRT1 in FIG. 5. In FIG. 6, a first reference temperature TR1 and a first local temperature TL1 correspond to a case when the target temperature TRT is fixed to approximately 83° C. (181.4° F.) and a second reference temperature TR2 and a second local temperature TL2 correspond to a case when the target temperature TRT is fixed to approximately 77° C. (170.6° F.).

In general, a spot of the most significant or active heat source may be selected as the local spot LS to monitor a temperature of the local spot LS for the DTM operation. The spot of the most significant heat source, that is, the spot of the maximum temperature may be varied depending on the operational scenario of the electronic device and thus the local temperature TL of the local spot LS corresponding to the hot spot may be increased excessively.

As illustrated in FIG. 6, if the target temperature is fixed to about 83° C., overshooting of the temperature may be caused due to increase of the power level according to the DVFS operation and thus the first local temperature TL1 may be increased abruptly to about 125° C. (257° F.). The abrupt temperature increases may result in malfunction of a circuit in the vicinity of the local spot LS and could potentially cause irreversible damage to the circuit.

To address and overcome such problems, the target temperature TRT may be lowered to 77C so that the second local temperature TL2 may be kept below 120C(248° F.). However, if the target temperature TRT is lowered, the power level according to the DVFS operation may be limited excessively and thus the performance of the electronic device may be degraded, which is an inconvenience to the user. In other words, if the target temperature TRT is fixed to a lower value without consideration of the present operational conditions, the operational voltage and/or the operational frequency may be lowered unnecessarily. As a result the unnecessary lowered power level may cause degradation of the performance of the electronic device.

FIG. 7 represents the local temperature TL and the reference temperature TR when the target temperature TRT is changed based on the local temperature TL as the second case TRT2 in FIG. 5. In FIG. 7, a third reference temperature TR3 and a third local temperature TL3 correspond to a case when the target temperature TRT is decreased as the local temperature TL increases.

Overshooting of the third local temperature TL3 may be suppressed as represented in FIG. 7 if the target temperature TRT is decreased as the local temperature TL increases. The performance of the electronic device may be degraded unnecessarily because the target temperature TRT is not fixed to a relatively low level. This may result in degraded performance.

The high-temperature region REG indicated by a circuit in FIG. 7 by a dashed circle, is a relatively small interval of the entire operation time. Overshooting of the local temperature TL may be prevented by sufficiently decreasing the target temperature TRT during the relatively short time interval corresponding to the high-temperature region REG and the performance of the electronic device may be enhanced by increasing the target temperature TRT during the long time interval of operation beyond the high-temperature region REG As such, the method of dynamic thermal management of the electronic device according to some embodiments may efficiently perform thermal management of the electronic device by changing the target temperature corresponding to a limit value determined by the reference temperature based on the local temperature when the local spot and the reference spot are thermally coupled. The target temperature may be set to a relatively high value to secure performance of the electronic device when the local temperature is relatively low. Furthermore, the target temperature may be set to a relatively low value to pursue stability of the electronic device when the local temperature is relatively high, in comparison.

FIGS. 8, 9 and 10 are diagrams representing various methods of thermal management of an electronic device when a target temperature is changed according to example embodiments. In FIGS. 8, 9 and 10, the horizontal axis indicates the local temperature TL of the local spot LS and the vertical axis represent the target temperature TRT corresponding to a limit value of the reference temperature TR.

Referring to FIGS. 8 and 9, the target temperature TRT may change by setting a boundary value T0 of the local temperature TL and controlling the change of the target temperature TRT based on the local temperature TL and the boundary value T0 and the relationship of the boundary value and the local temperature.

In some embodiments, as represented in FIG. 8, the target temperature generator 180 in FIG. 4 may maintain the target temperature TRT to be constant regardless of the local temperature TL when the local temperature TL is lower than the boundary value T0 and may decrease the target temperature TRT as the local temperature TL increases when the local temperature TL is higher than the boundary value T0. In some embodiments, the boundary value T0 can be viewed as a threshold temperature. At values greater than the threshold temperature T0, greater control of the operating temperature is desired in order to manage the target temperature.

In other example embodiments, as represented in FIG. 9, the target temperature generator 180 may decrease the target temperature TRT according to a first negative slope as the local temperature TL increases when the local temperature TL is lower than the boundary value T0 and may decrease the target temperature TRT with a second negative slope of greater magnitude than the first negative slope as the local temperature TL increases to a level higher than the boundary value T0. Referring to FIG. 9, the first slope corresponds to $|\tan(\theta 1)|$ and the second slope corresponds to $|\tan(\theta 2)|$.

Even though the example embodiments of FIGS. 8 and 9 illustrate a single boundary value T0, those skilled in the art may understood that a plurality of boundary values may be set at different ranges on the graph and methods of changing the target temperature TRT may be determined with respect to each range of the local temperature TL.

In some example embodiments, the values T0, θ1 and θ2 may be provided through the control signal TCTR and stored in the register unit 140 in FIG. 4 during an initializing process of the electronic device. The values T0, θ1 and θ2 may be determined properly in a designing process or a testing process of the electronic device depending on the operational scenario of the electronic device. These values can be used to determine the rate at which the target temperature changes.

Referring to FIG. 10, in another embodiment, the target temperature TRT may be changed by setting a plurality of temperature sections labeled as TSECi where i=1, 2, 3, 4, etc. . . . such as TSEC1~TSEC4 of the local temperature TL and determining sectional values TYi where i=1, 2, 3, etc. . . . . TY1~TY4 of the target temperature TRT with respect to the plurality of temperature sections TSEC1~TSEC4, respectively. FIG. 10 illustrates the four temperature sections of the local temperature TL for convenience of illustration and description, the number of the temperature sections may be determined variously. For example, fewer than four sections or more than four sections may be employed.

As illustrated in FIG. 10, the sectional values TY1~TY4 of the target temperature TRT may be decreased sequentially, that is, step by step, as the local temperature TL increases.

In some example embodiments, all widths of the temperature sections TSEC1~TSEC4, defined in units of temperature, may be set to be equal. In other example embodiments, the lengths of at least two temperature sections among the temperature sections TSEC1~TSEC4 may be set to be different or may have uneven steps in each direction.

In some example embodiments, all intervals dTY1~dTY3 between the sectional values TY1~TY4, defined in units of temperature, may be set to be equal. In other example embodiments, at least two intervals among the intervals dTY1~dTY3 may be set to be different.

The boundary values TX1~TX5 for setting the temperature sections TSEC1~TSEC4 and the sectional values TY1~TY4 may be determined properly in a designing process or a testing process of the electronic device depending on the operational scenario of the electronic device.

In other embodiments, the section values may be linear or constant between steps in the temperatures.

As such, the method of dynamic thermal management of the electronic device according to example embodiments may efficiently perform thermal management of the electronic device by changing the target temperature corresponding to a limit value of the reference temperature based on the local temperature when the local spot and the reference spot are thermally coupled. In some embodiments, the target temperature may be set to a relatively high value to secure performance of the electronic device when the local temperature is relatively low. In other embodiments, target temperature may be set to a relatively low value to secure stability of the electronic device when the local temperature is relatively high.

Hereinafter, with reference to FIGS. 11 through 14, example embodiments are described with respect to an embodiment where the local spot LS corresponds to a hot spot of a semiconductor chip included in a portable electronic device and the reference spot RS corresponds to a spot on a housing case of the portable electronic device.

Figure 11:
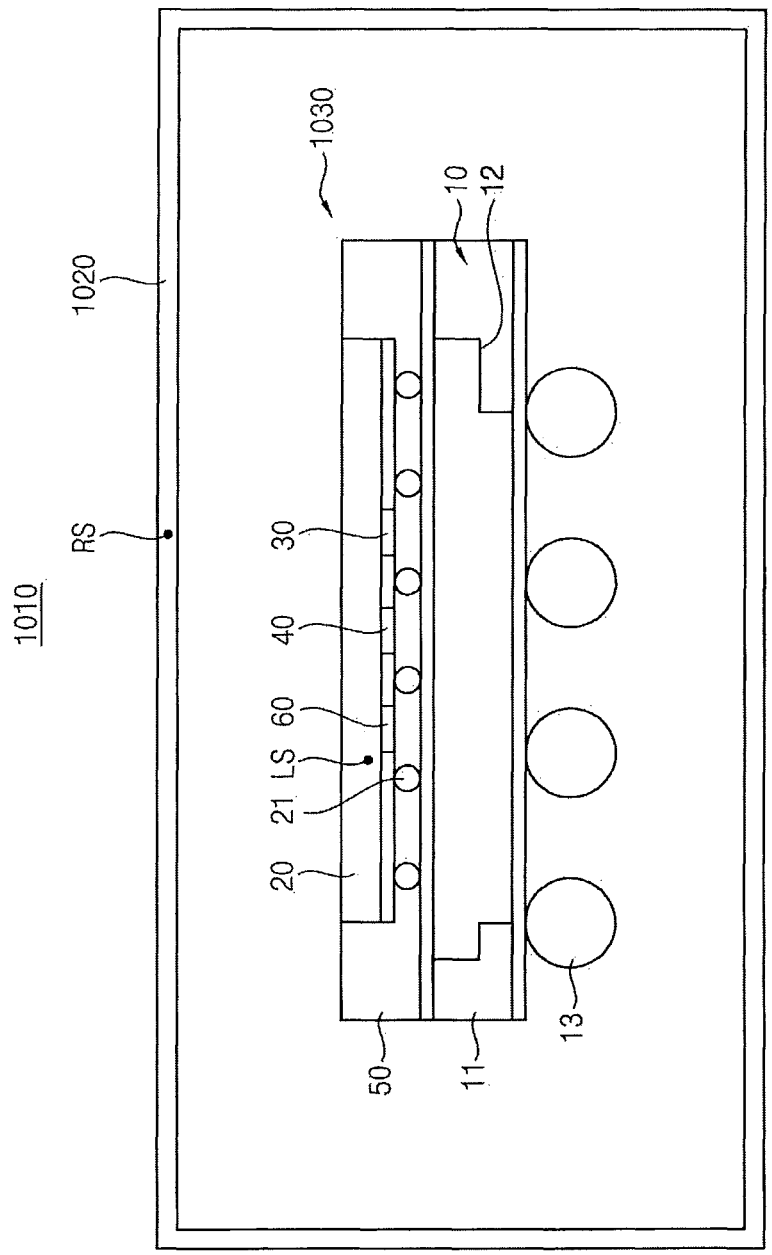
FIG. 11 is a conceptual diagram representing an electronic device according to some embodiments of the present disclosure.

FIG. 11 is a conceptual diagram representing an electronic device according to example embodiments.

Referring to FIG. 11, an electronic device 1010 may be a portable or mobile electronic device that comprises a housing case 1020 and a semiconductor package 1030 mounted in the housing case 1020. The semiconductor package 1030 may include a package board or circuit board 10 comprising an electrical circuit pattern 12 therein, a semiconductor chip 20 mounted on the package board 10 and electrically connected to the circuit pattern 12 of the package board 10, a reference temperature sensor 30 to detect a reference temperature TR (as described herein) of a reference spot RS on the housing case 1020, a local temperature sensor 60 to detect a local temperature TL (as described herein) of a local spot LS (as described herein) on the semiconductor chip 20 and a temperature management unit 40 to control operations of the semiconductor chip 20 based on the local temperature TL and the reference temperature TR.

The package board 10 may comprise a plate having a sufficient rigidity and may include the circuit pattern 12 at an upper face and a lower face. For example, the package board 10 may comprise a body 11 shaped into a sufficiently rigid plate. The body 11 may include insulating and heat-resistive materials which may help to maintain or manage the temperature of the interior or exterior of the electronic device. The circuit pattern 12 may be arranged inside the body 11. The circuit pattern 12 may include a plurality of conductive lines and may be connected to a plurality of contact pads (not shown) arranged on the front and the lower faces of the body 11. Contact terminals 13 may be arranged on the contact pads, at a bottom of the package board 10 and an external contact element (not shown) may make contact with the contact terminals 13. The semiconductor chip 20 may make contact with the contact pads on the upper face of the body 11 and, thus, the semiconductor chip 20 and the external contact element may be electrically connected to each other through the circuit pattern 12 and the contact terminals 13. For example, the contact terminals 13 may include a solder ball, also known a solder bumps, as known to those of ordinary skill in the art.

In some embodiments the body 11 may comprise a thermosetting plastic plate such as an epoxy resin plate and/or a polyimide plate or any other thermosetting plastic plate known to those of ordinary skill in the art. In another embodiment, the body 11 may include a plate on which a heat-resistive organic film, such as, a liquid crystal polyester film and/or a polyamide film or any other heat-resistive organic film known to those of ordinary skill in the art, may be coated. The circuit pattern 12 may include a plurality of conductive lines or wirings that may be electrically connected with the semiconductor chip 20 and the external contact elements. The circuit pattern 12 may include a power line for applying an electric power, a plurality of signal lines for communicating data signals with the semiconductor chip 20 and a ground line for electrically grounding the signal lines and the power line. The conductive lines or the wirings of the circuit pattern 12 may be electrically insulated from one another by, for example, a plurality of insulation interlayers (not shown). The package board 10 may include a printed circuit board (PCB) in which the circuit pattern 12 may be formed by, for example, a printing process.

The semiconductor chip 20 may include an active device such as an integrated circuit device mounted on the package board 10. Therefore, when the driving power is applied to the semiconductor chip 20, an electrical operation such as an electrical amplification and an electrical oscillation may be conducted and, as a result, driving heat may be generated from the semiconductor chip 20. For example, the semiconductor chip 20 may include a plurality of conductive structures (not illustrated) stacked on a semiconductor substrate such as a silicon wafer or any other suitable substrate known to those of ordinary skill in the art. The conductive structure may be stacked on the semiconductor substrate using a plurality of insulation interlayers and a plurality of wiring structures separated from the conductive structures by the individual insulation interlayers. The wiring structure may transfer signals to the conductive structures. The conductive structures and the wiring structures may be protected from their surroundings by a passivation layer (not shown).

The semiconductor chip 20 may include a flip chip, also known as controlled collapse chip, structure in which an active face of the semiconductor chip 20 may face down toward an upper surface of the package board 10 and, thus, interconnectors 21 such as solder bumps may be interposed between electrode pads (not shown) of the semiconductor chip 20 and the contact pads of the package board 10. Therefore, the semiconductor chip 20 may be electrically connected to the circuit board 10 via the various interconnectors 21. The interconnectors 21 may be bonded to the circuit board 10 by a heat treatment for example, a reflow process and the gap space between the semiconductor chip 20 and the upper surface of the package board 10 may be filled up with an under-filling layer (not shown). Thus, the semiconductor chip 20 may be electrically and mechanically bonded to the circuit board 10 with high and increased reliability due to the interconnectors 21 and the under-filling layer. An encapsulant 50 may be arranged on the package board 10 sufficiently covering the semiconductor chip 20. The semiconductor chip 20 may be sufficiently encapsulated from its external surroundings and may be stably fixed to the package board 10. In some embodiments, the encapsulant 50 may include a molding unit (not shown) comprising an insulating resin arranged on a whole surface of the package board 10 covering the semiconductor chip 20, and an under-filling layer (not shown) interposed between the package board 10 and the semiconductor chip 20. This may allow for securing of the semiconductor chip 20 to the package board 10.

Although not shown in FIG. 11, the semiconductor chip 20 may also be mounted on the circuit board 10 in a configuration where the active face may face upward and thus the semiconductor chip 20 may be bonded to the package board 10 utilizing a bonding wire. The semiconductor chip 20 may include a single or a multi-chip structure such as a chip stack package in which a plurality of the chips may be stacked. Particularly, the chips of the multi-chip structure may be electrically connected with each other by various connecting member such as, for example, penetration electrodes, bonding wires, or other suitable connecting members known to those of ordinary skill in the art.

In some embodiments, the reference temperature sensor 30 detects the reference temperature TR of the reference spot RS may be a non-contact temperature sensor. The non-contact temperature sensor 30 may be positioned inside of the semiconductor package 1030 and may detect a temperature of the reference spot RS that is spaced apart from the non-contact temperature sensor 30. In some embodiments, the non-contact temperature sensor 30 may include an infrared temperature sensor which may detect a surface temperature of the housing case 1020 by using an infrared radiation or multiple infrared radiation sources emitted from the reference spot RS.

The semiconductor package 1030 may include the local temperature sensor 60 to detect the local temperature of the semiconductor chip 20. The temperature of the semiconductor package 1030 is determined primarily by the heat generated by the semiconductor chip 20. Accordingly the local temperature sensor 60 may be in communication with the semiconductor chip 20 to detect the local temperature TL at the local spot LS. For example, the local temperature sensor 60 may be implemented as an on-chip temperature sensor as described herein with reference to FIGS. 12 and 13.

As described above, the temperature management unit 40 may generate the temperature information DTI and the target temperature TRT corresponding to a limit value of the reference temperature TR based on the coupling between the local temperature TL and the reference temperature TR. According to some embodiments, the temperature management unit 40 may adjust the target temperature TRT based on the local temperature TL.

Figure 12:
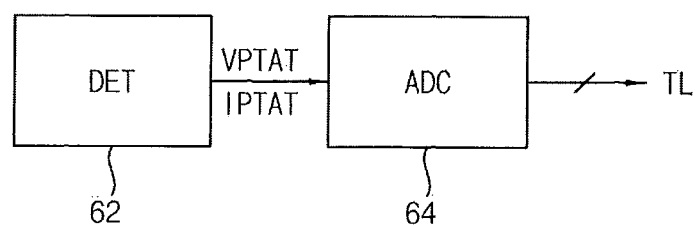
FIG. 12 is a block diagram representing some embodiments of a local temperature sensor included in the electronic device of FIG. 11.
Figure 13:
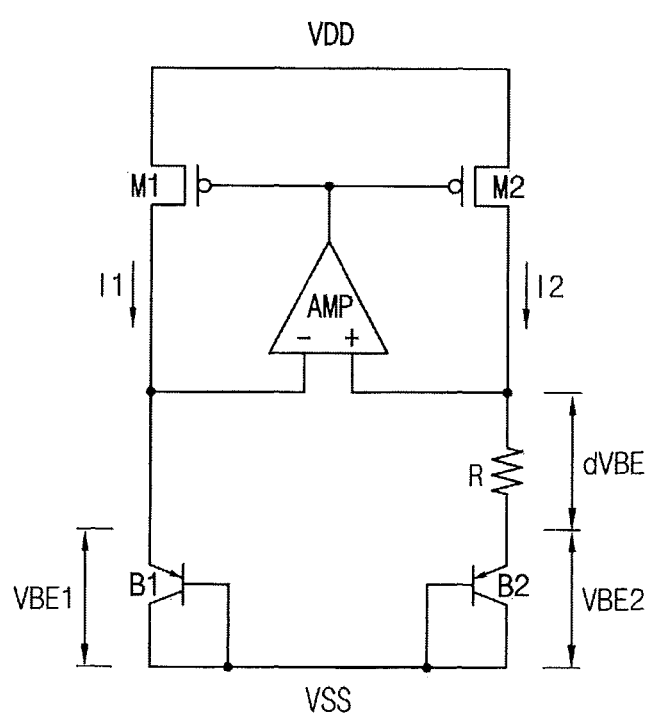
FIG. 13 is a circuit diagram representing some embodiments of a temperature detector included in the local temperature sensor of FIG. 12.

FIG. 12 is a block diagram representing an example embodiment of a local temperature sensor included with the electronic device of FIG. 11, and FIG. 13 is a circuit diagram illustrating an example embodiment of a temperature detector included in the local temperature sensor of FIG. 12.

Referring to FIG. 12, a local temperature sensor 60 may include a temperature detector (DET) 62 and an analog-to-digital convertor (ADC) 64. The temperature detector 62 may output at least one of a voltage signal VPTAT and a current signal IPTAT proportional to the local temperature TL taken from a local spot LS. The analog-to-digital converter 64 may convert the output of the temperature detector 62 to a digital signal to determine the local temperature TL represented by n bits.

In some embodiments, the temperature detector 62 may be implemented with first and second PMOS transistors M1, M2, a feedback amplifier AMP, a resistor R and first and second bipolar transistors B1, B2, which are coupled between a power supply voltage VDD and a ground voltage VSS as represented in FIG. 13. A voltage dVBE across the resistor R may be obtained as Expression 1

$$dVBE = VBE1 - VBE2 \quad \text{(Expression 1)}$$
$$= VT^*\text{Ln}(Ic1/Is1) - VT^*\text{Ln}(n^*Ic2/Is2)$$
$$= VT^*\text{Ln}(n)$$

In Expression 1, Is1 and Is2 indicate reverse saturation currents of the bipolar transistors B1, B2. Also, Ic1 and Ic2 indicate currents flowing through the bipolar transistors B1, B2. Additionally, n is a gain ratio of the bipolar transistors B1, B2, and VT indicates a temperature voltage that is proportional to an absolute temperature of the temperature detector 62. Ln(n) is a constant value and thus the voltage dVBE across the resistor R and the current I2 flowing through the resistor R are proportional to the temperature variation. The voltage signal VPTAT and the current signal IPTAT may be generated as an output based on the voltage dVBE and the current I2 proportional to the operational temperature.

The on-chip temperature sensor described with reference to FIGS. 12 and 13 may be integrated in the same semiconductor die in which a circuit corresponding to the hot spot is integrated, to be used in a similar manner as the above-described reference temperature sensor.

Figure 14:
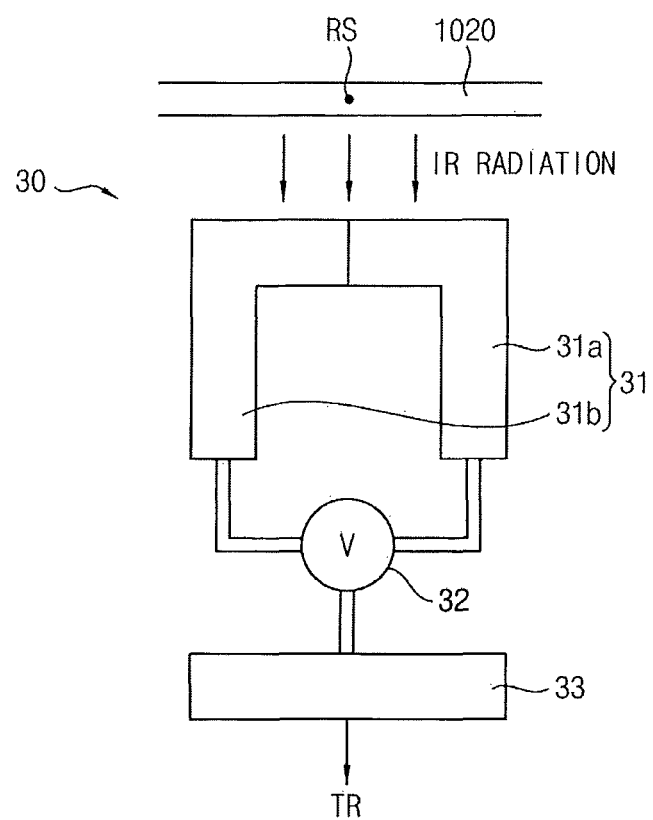
FIG. 14 is a diagram representing some embodiments of a reference temperature sensor included in the electronic device of FIG. 11.

FIG. 14 is a diagram representing an example embodiment of a reference temperature sensor included in the electronic device of FIG. 11.

Referring to FIG. 14, a non-contact temperature sensor 30 may include an infrared (IR) responsive thermocouple 31. The IR responsive thermocouple 31 generates an electromotive force by absorbing the infrared radiant heat emitted from a reference spot RS on the housing case 1020.

Also shown is a voltmeter 32 connected to the thermocouple 31 to measure an electromotive force and a detecting unit 33 which operates in conjunction with the voltmeter 32 to detect the reference temperature TR from the measured electromotive force.

The thermocouple 31 may include a pair of first and second metal wirings 31a and 31b having different physical properties from each other. First end portions of the first and the second metal wirings 31a and 31b may be coupled to form a joint portion and second end portions of the first and the second metal wirings 31a and 31b may be connected to the voltmeter 32, at each side respectively. When the joint portion of the thermocouple 31 is heated by the infrared radiant heat from the external heat source, an electromotive force may be generated at the joint portion J (not shown) by the Seebeck effect. The electrical current caused by the electromotive force generated at the joint portion J may pass through the first and the second metal wirings 31a and 31b. The electrical potential energy generated by the electrical current may be detected by the voltmeter 32 that is connected to the second ends of the first and the second metal wirings 31a and 31b. The joint portion of the thermocouple 31 may be positioned at a site relatively close enough where the infrared radiant heat from the reference spot RS may sufficiently reach the joint portion of the thermocouple 31. For example, the first and the second metal wirings 31a and 31b may comprise any one material selected from the group consisting of platinum (Pt), iron (Fe), copper (Cu), constantan, or any other suitable material known to those of ordinary skill in the art. In the present example embodiments, the pair of the first and the second metal wirings 31a and 31b may include one of a platinum (Pt)-platinum (Pt) pair, an iron (Fe)-constantan pair and a constantan-copper (Cu) pair.

In some embodiments, the non-contact temperature sensor 30 may be spaced apart from the reference spot RS and provide the surface temperature of the housing case 1020, that is, the reference temperature TR using the IR radiation heat from the reference spot RS.

According to a DTM operation, a target temperature of the semiconductor chip and/or a target temperature of the housing case may be determined and set in advance, and performance of a power level of the semiconductor chip may be restricted automatically if the operational temperature of the semiconductor chip exceeds the predetermined target temperature and/or if the operational temperature of the housing case exceeds the predetermined target temperature. According to some embodiments, the temperature management of the mobile electronic device may be performed efficiently by changing the target temperature of the housing case based on the temperature of the semiconductor chip.

Figure 15:
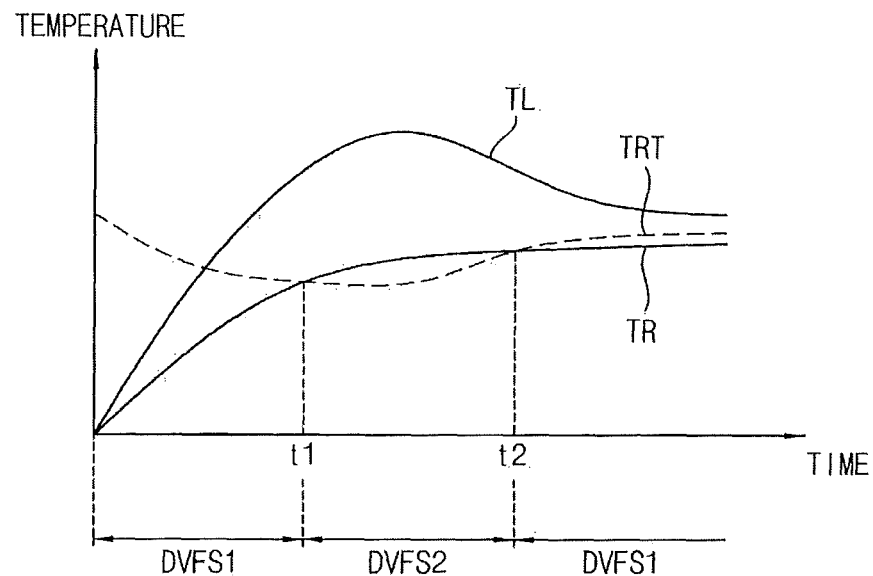
FIG. 15 is a diagram representing a method of temperature management according to some embodiments of the present disclosure.

FIG. 15 is a diagram representing a method of temperature management according to example embodiments.

Referring to FIG. 15, according to example embodiments, the target temperature TRT may be changed based on the local temperature TL. For example, the target temperature TRT may be decreased as the local temperature Tl increases, as described herein.

In some example embodiments, a power level of an electronic device may be controlled by comparing the reference temperature TR and the target temperature TRT to perform the DVFS operation based on the comparison result. As described above, the DVFS operation may be performed by controlling least one of the operational voltage and the operational frequency.

As illustrated in FIG. 15, the power level may be controlled using a first DVFS operation DVFS1 before time point t1 and after time point t2 while the reference temperature TR is lower than the target temperature TRT, and the power level may be controlled using a second DVFS operation DVFS2 between time points t1 and t2 while the reference temperature TR is higher than the target temperature TRT. In the second DVFS operation DVFS2, the power level may be set lower than that of first DVFS operation DVFS1 to prevent the local temperature TL from being increased excessively.

Figure 16:
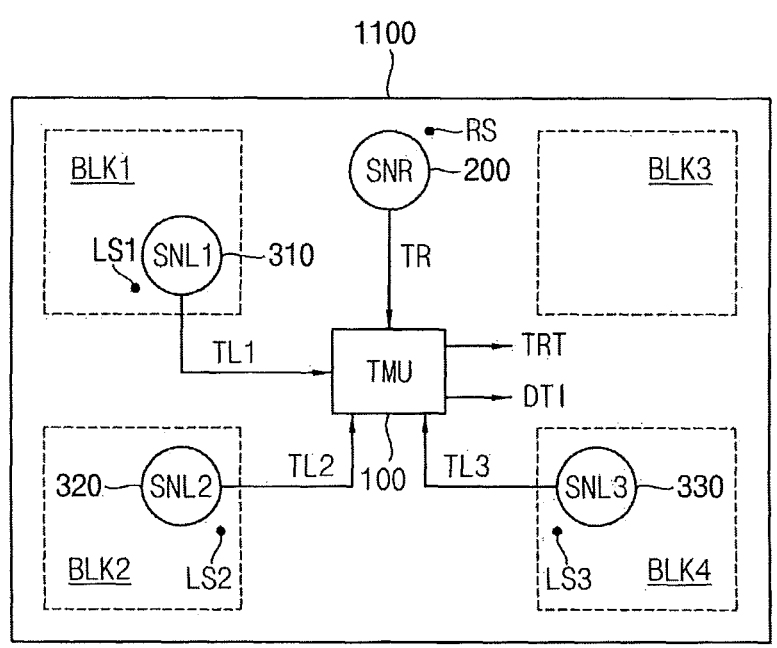
FIG. 16 is a diagram representing a layout of a temperature management circuit in an electronic device according to some embodiments of the present disclosure.

FIG. 16 is a diagram representing a layout of a temperature management circuit in an electronic device according to example embodiments.

Referring to FIG. 16, a temperature management circuit in an electronic device 1100 includes a temperature management unit also referred to as and shown as a thermal management unit TMU 100, a reference temperature sensor (SNR) 200 and a plurality of local temperature sensors SNL1, SNL2, SNL3, 310, 320, 330. FIG. 16 illustrates three local temperature sensors for convenience of description; however, the number of the local temperature sensors may vary according to a configuration of the electronic device 1100 while meeting the operation requirements of a given electronic device. Other elements in the electronic device 1100 are omitted except for the temperature management circuit.

The electronic device 1100 may include a system on chip (SOC) (not shown) and the SOC may include a plurality of subsidiary blocks BLKi, in which i=1,2,3,4, which may be individualized by their own functions. For example, the subsidiary blocks BLKi may include a core block including a central processing unit, a memory controller, a display controller block, a file system block, a graphic processing unit block, an image signal processing block, a multi-format codec block, and any other suitable block known to those of ordinary skill in the art. These subsidiary blocks may be significant heat sources of the SOC and it may be necessary to monitor and control the respective temperatures of the subsidiary blocks BLKi in addition to the overall temperature of the SOC.

The reference temperature sensor 200 may measure a temperature of a reference spot RS to provide a reference temperature TR. The local temperature sensors 310, 320 and 330 may measure temperatures of local spots LS labeled LS1, LS2 and LS3 to provide local temperatures TL labeled TL1, TL2 and TL3, respectively. The reference spot RS and the local spots LS1, LS2 and LS3 may be spaced apart and may be thermally coupled through media having certain thermal conductivities.

In some embodiments, the temperature management unit 100 may provide a target temperature TRT and temperature information DTI based on the local temperatures TL1, TL2, TL3, . . . TLx and the reference temperature TR. According to some embodiments, the temperature management unit 100 may change the target temperature TRT corresponding to a limit value of the reference temperature TR based on one or more of the measured local temperatures TL1, TL2 TL3, . . . TLx. The power level of the electronic device 1100 may be controlled based on the temperature information DTI and the target temperature TRT from the temperature management unit 100.

The local spots LS1, LS2, LS3 . . . LSx may correspond to hot spots adjacent to heat sources or heat aggressors in the electronic device 1100 and the local spot LS may be an arbitrary spot that is affected by the temperatures of the local spots LS1, LS2, LS3, LSx. The reference temperature TR of the reference spot LS may be lower than a maximum temperature of the local temperatures TL1, TL2, TL3, TLx.

In some embodiments, a maximum local temperature (TLm) may be determined among the plurality of local temperatures TL1, TL2, TL3, TLx as Expression 2.

$$TLm=\text{MAX}\{TL1,TL2,TL3,TLx\} \qquad \text{(Expression 2)}$$

The target temperature TRT may be changed based on the maximum local temperature TLm. It may be noted that the higher local temperature has the greater influence on the reference temperature, and thus the target temperature TRT may be changed based on the maximum local temperature TLm. The method of changing the target temperature TRT based on the maximum local temperature TLm can, in some embodiments, be the same as the method of changing the target temperature TRT based on the one local temperature TL as described above.

In other example embodiments, an average local temperature (Tla) corresponding to an average of the plurality of local temperatures TL1, TL2, TL3 TLx may be determined as Expression 3.

$$TLa=(TL1+TL2+TL3+\ldots+TLx)/x \qquad \text{(Expression 3)}$$

In some embodiments, the target temperature TRT may be changed in response to the average local temperature TLa. When a plurality of heat sources affect the reference temperature TR of the reference spot RS, the target temperature TRT may be controlled by considering all of the heat sources in the device.

In still other embodiments, a weighted average local temperature TLwa may be determined such that the weighted average local temperature TLwa corresponds to an average of the plurality of local temperatures TL1, TL2, TL3 TLx multiplied respectively by weight values W1, W2, W3 . . . Wx as Expression 4.

$$TLwa=(W1*TL1+W2*TL2+W3*TL3+\ldots+Wx*TLx)/x \qquad \text{(Expression 4)}$$

The target temperature TRT may be changed based on the weighted average local temperature TLwa. The influences of the heat sources on the reference temperature TR of the reference spot RS may be represented by the weight values W1, W2, W3 . . . Wx. In some example embodiments, the weight values W1, W2, W3 . . . Wx may correspond to thermal conductivities between the reference spot RS and the plurality of local spots LS1, LS2, LS3, . . . LSx. The target temperature TRT may be controlled more precisely by considering influence degrees of the heat sources on the reference temperature TR of the reference spot RS.

Figure 17:
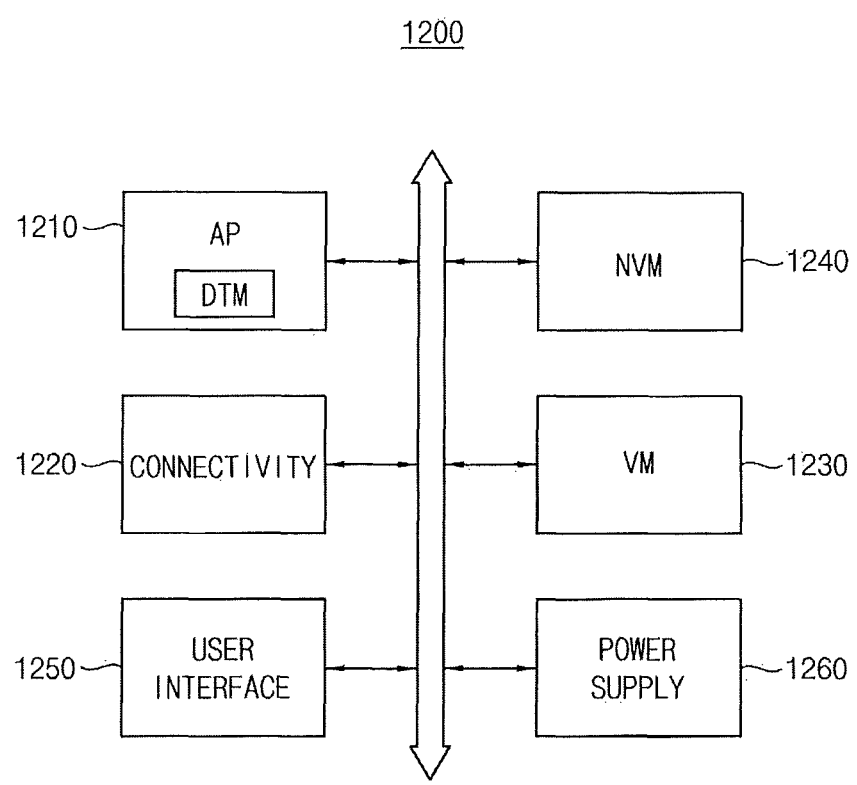
FIG. 17 is a diagram representing a mobile device according to some embodiments of the present disclosure.

FIG. 17 is a diagram representing a mobile device according to example embodiments.

Referring to FIG. 17, a mobile device 1200 includes an application processor (AP) 1210, a connectivity unit 1220, a volatile memory device (VM) 1230, a nonvolatile memory device (NVM) 1240, a user interface 1250, and a power supply 1260. In some embodiments, the mobile device 1200 may comprise an electronic device such as a mobile phone, a smart phone, a personal digital assistant (PDA), a portable multimedia player (PMP), a digital camera, a music player, a portable game console, a navigation system, or another type of electronic device known to one of ordinary skill in the art.

The application processor 1210 may execute applications such as a web browser, a game application, a video player, or any other function a user determines is necessary on their device. The connectivity unit 1220 may perform wired or wireless communication with an external electronic device. The volatile memory device 1230 may store data processed by the application processor 1210 or may operate as a working memory. The nonvolatile memory device 1240 may store a boot image for booting the mobile device 1200. The user interface 1250 may include at least one input device, such as a keypad, a touch screen, or any other similar feature, and at least one output device, such as a speaker, a display device, etc. The power supply 1260 may supply a power supply voltage to the mobile device 1200.

The application processor 1210 may include a dynamic thermal management (DTM) circuit as described above. The DTM circuit may provide a local temperature by measuring a temperature of a local spot in the mobile device 1200 and provide a reference temperature by measuring a temperature of a reference spot in the electronic device where the reference spot is thermally coupled to the local spot. The DTM circuit may change a target temperature, also referred to as TRT above, corresponding to a limit value of the reference temperature based on the local temperature, and a power level of the electronic device may be controlled based on the target temperature.

As described above, the method of dynamic thermal management of the electronic device according to example embodiments may efficiently perform thermal management of the electronic device by changing the target temperature corresponding to a limit value of the reference temperature based on the local temperature when the local spot and the reference spot are thermally coupled. In some embodiments, the target temperature may be set to a relatively high value to secure performance of the electronic device when the local temperature is relatively low. On the other hand, in some embodiments, the target temperature may be set to a relatively low value to achieve operational stability of the electronic device when the local temperature is relatively high.

The present inventive concepts may be applied to any devices and systems including a memory device requiring temperature management. For example, the present inventive concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or any other suitable device known to those of ordinary skill in the art The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of dynamic thermal management of an electronic device, the method comprising:
   providing a local temperature measurement by measuring a local temperature of a local spot in the electronic device using a temperature sensor on a semiconductor die in which a heat source of the electronic device is integrated, wherein the local spot corresponds to a hot spot adjacent to the heat source of the electronic device;
   providing a reference temperature measurement by measuring a reference temperature of a reference spot in the electronic device, the reference spot being thermally coupled to the local spot;
   changing a limit value of the reference temperature measurement directly based on the local temperature measurement; and
   controlling a power output of the electronic device based on the limit value of the reference temperature measurement,
   wherein changing the limit value of the reference temperature measurement comprises:
   comparing the local temperature measurement and a boundary value of the local temperature measurement;
   decreasing the limit value of the reference temperature measurement with a first slope as the local temperature measurement increases when the local temperature measurement is lower than the boundary value; and
   decreasing the limit value of the reference temperature measurement with a second slope of greater magnitude than the first slope as the local temperature measurement increases when the local temperature measurement is higher than the boundary value.

2. The method of claim 1, wherein the reference spot is affected by the local temperature measurement of the local spot.

3. The method of claim 1, wherein changing the limit value of the reference temperature measurement further comprises decreasing the limit value of the reference temperature measurement when the local temperature measurement increases.

4. The method of claim 1, wherein changing the limit value of the reference temperature measurement comprises:
   setting the boundary value of the local temperature measurement; and
   controlling a change of the limit value of the reference temperature measurement based on the local temperature measurement and the boundary value.

5. The method of claim 1, wherein changing the temperature comprises:
   setting a plurality of temperature sections of the local temperature measurement; and
   determining sectional values of the limit value of the reference temperature measurement with respect to the plurality of temperature sections, respectively.

6. The method of claim 5, wherein the sectional values of the limit value of the reference temperature measurement are decreased sequentially as the local temperature measurement increases.

7. The method of claim 1, wherein providing the local temperature measurement comprises:
   providing a plurality of local temperature measurements by measuring temperatures of a plurality of local spots, and
   wherein changing the limit value of the reference temperature measurement comprises:
   adjusting the limit value of the reference temperature measurement based on the plurality of local temperature measurements from the plurality of local spots.

8. The method of claim 7, wherein changing the target temperature based on the plurality of local temperature measurements comprises:
   determining a maximum local temperature among the plurality of local temperature measurements; and
   adjusting the limit value of the reference temperature measurement based on the maximum local temperature.

9. The method of claim 7, wherein changing the limit value of the reference temperature measurement based on the plurality of local temperature measurements further comprises:
   determining an average local temperature corresponding to an average of the plurality of local temperature measurements; and
   adjusting the limit value of the reference temperature measurement based on the average local temperature.

10. The method of claim 7, wherein changing the limit value of the reference temperature measurement based on the plurality of local temperature measurements further comprises:
    determining a weighted average local temperature measurement corresponding to an average of the plurality of local temperature measurements multiplied by weight values; and
    adjusting the limit value of the reference temperature measurement based on the weighted average local temperature measurements.

11. The method of claim 10, wherein the weight values correspond to thermal conductivities between the reference spot and the plurality of local spots.

12. The method of claim 1, wherein controlling the power output of the electronic device further comprises:
    comparing the reference temperature measurement and the limit value of the reference temperature measurement to generate a comparison result; and
    controlling at least one of an operational voltage and an operational frequency of the electronic device based on the comparison result.

13. A method of dynamic thermal management of a portable electronic device comprising:
    providing a local temperature measurement by measuring a temperature of a hot spot adjacent to a heat source of the portable electronic device;
    providing a reference temperature measurement by measuring a temperature of a housing case of the portable electronic device using a sensor on the housing case, the housing case being thermally coupled to the hot spot;

adjusting a limit value of the reference temperature measurement when the local temperature measurement increases; and controlling a power level of the portable electronic device based on the limit value of the reference temperature measurement, wherein adjusting the limit value of the reference temperature measurement comprises:

comparing the local temperature measurement and a boundary value of the local temperature measurement;

decreasing the limit value of the reference temperature measurement with a first slope as the local temperature measurement increases when the local temperature measurement is lower than the boundary value; and decreasing the limit value of the reference temperature measurement with a second slope of greater magnitude than the first slope as the local temperature measurement increases when the local temperature measurement is higher than the boundary value.

14. The method of claim 13, wherein adjusting the limit value of the reference temperature measurement when the local temperature increases further comprises:

setting the boundary value of the local temperature measurement; and controlling a change of the limit value of the reference temperature measurement based on the local temperature measurement and the boundary value.

15. The method of claim 13, wherein adjusting the limit value of the reference temperature measurement when the local temperature measurement increases further comprises:

setting a plurality of temperature sections of the local temperature measurement; and determining sectional values of the limit value of the reference temperature measurement with respect to the plurality of temperature sections, respectively, such that the sectional values of the limit value of the reference temperature measurement are decreased sequentially as the local temperature measurement increases.

16. The method of claim 13, wherein providing the local temperature measurement further comprises:

providing a plurality of local temperature measurements by measuring temperatures of a plurality of hot spots, and wherein decreasing the limit value of the reference temperature measurement when the local temperature measurement increases includes:

changing the limit value of the reference temperature measurement based on the plurality of local temperature measurements.

17. A temperature management circuit of an electronic device, comprising:

a local temperature sensor configured to provide a local temperature measurement by measuring a temperature of a local spot in the electronic device, wherein the local temperature sensor is as an on-chip temperature sensor that is integrated in a semiconductor die in which a circuit corresponding to a heat source of the electronic device is integrated and wherein the local spot corresponds to a hot spot adjacent to the heat source of the electronic device;

a reference temperature sensor configured to provide a reference temperature measurement by measuring a temperature of a reference spot in the electronic device, the reference spot being thermally coupled to the local spot; and a temperature management unit configured to change a limit value of the reference temperature measurement directly based on the local temperature measurement wherein changing the limit value of the reference temperature measurement comprises:

comparing the local temperature measurement and a boundary value of the local temperature measurement;

decreasing the limit value of the reference temperature measurement with a first slope as the local temperature measurement increases when the local temperature measurement is lower than the boundary value; and decreasing the limit value of the reference temperature measurement with a second slope of greater magnitude than the first slope as the local temperature measurement increases when the local temperature measurement is higher than the boundary value.

18. The temperature management circuit of claim 17, wherein the reference temperature sensor is implemented as a non-contact temperature sensor.

* * * * *